United States Patent
Prakash et al.

(10) Patent No.: US 10,297,310 B2
(45) Date of Patent: May 21, 2019

(54) SYSTEM AND METHOD FOR MULTI-CYCLE WRITE LEVELING

(71) Applicant: INVECAS TECHNOLOGIES PVT. LTD., Hyderabad (IN)

(72) Inventors: Gyan Prakash, Hatia Ranchi (IN); Nidhir Kumar, Bangalore (IN)

(73) Assignee: INVECAS TECHNOLOGIES PVT. LTD, Hyderabad (IN)

( * ) Notice: Subject to any disclaimer, the term of this patent is extended or adjusted under 35 U.S.C. 154(b) by 0 days.

(21) Appl. No.: 15/554,000

(22) PCT Filed: Feb. 24, 2016

(86) PCT No.: PCT/IN2016/000048
§ 371 (c)(1),
(2) Date: Aug. 27, 2017

(87) PCT Pub. No.: WO2016/135744
PCT Pub. Date: Sep. 1, 2016

(65) Prior Publication Data
US 2018/0075898 A1    Mar. 15, 2018

(30) Foreign Application Priority Data
Feb. 25, 2015 (IN) .............................. 892/CHE/2015

(51) Int. Cl.
| G11C 11/4076 | (2006.01) |
| G11C 8/18 | (2006.01) |
| G11C 29/02 | (2006.01) |
| G11C 11/4096 | (2006.01) |
| G11C 5/04 | (2006.01) |

(52) U.S. Cl.
CPC ............ *G11C 11/4076* (2013.01); *G11C 8/18* (2013.01); *G11C 11/4096* (2013.01); *G11C 29/023* (2013.01); *G11C 5/04* (2013.01); *G11C 2207/2254* (2013.01)

(58) Field of Classification Search
None
See application file for complete search history.

(56) References Cited

U.S. PATENT DOCUMENTS

2014/0177359 A1*  6/2014  Kumar ............... G11C 7/1066
                                                                    365/194

* cited by examiner

*Primary Examiner* — James G Norman
(74) *Attorney, Agent, or Firm* — Barry Choobin; Patent 360 LLC (57) ABSTRACT

A method and system for multi cycle write leveling are disclosed. At least three data patterns are written into consecutive address locations of a memory device via corresponding write operations. Subsequently, predetermined beats of data strobe signals corresponding to certain predetermined write operations are gated. Based at least on the gating of predetermined data beats, a target data pattern to be read from the memory device is determined. Subsequently, a data read operation is performed, and the data written onto a specific address location of the memory device is read there from. The data thus read from the memory device is compared with the target pattern. Based on the comparison of the data read from the memory device with the target pattern, a delay cycle between the data strobe signals and clock signal is determined, and the data strobe signal and clock signal are accordingly calibrated.

6 Claims, 6 Drawing Sheets

SYSTEM AND METHOD FOR MULTI-CYCLE WRITE LEVELING

CROSS REFERENCE TO RELATED APPLICATIONS

This Patent Application is a National Phase Application filed with respect to the PCT Application No. PCT/IN2016/000048 filed on Feb. 24, 2016 with the title "A SYSTEM AND METHOD FOR MULTI-CYCLE WRITE LEVELING". This Patent Application claims the priority of the Indian Provisional Patent Application No. 892/CHE/2015 filed on Feb. 25, 2015 with the title "MULTI-CYCLE WRITE LEVELING FOR DDR DRAM SYSTEM".

BACKGROUND

Technical field

The present disclosure relates to Dynamic Random Access Memory (DRAM) integrated Circuits (IC). Particularly, the present disclosure relates to multi-cycle write leveling in DRAM devices. More particularly, the present disclosure relates to synchronizing the clock signal and data strobe signal in a DRAM device using multi cycle write leveling procedure.

Description of the Related Art

Memory devices/systems used in computing systems typically incorporate one or more Dynamic Random Access Memory (DRAM) integrated circuits arranged on a memory module, for example, a DIMM (Dual In-Line Memory Module). A DIMM typically includes multiple DRAM devices serially mounted on a Printed Circuit Board (PCB), and is typically adapted to be used in personal computers, laptop computers, servers and the like. Typically, the operations of DRAM devices (on the DIMM) are controlled by a memory controller. Recent evolutions in the field of memory devices include DDR3 DRAM, third generation of the DDR DRAM family, which offers enhanced data bandwidth and signal quality.

Figure 1:
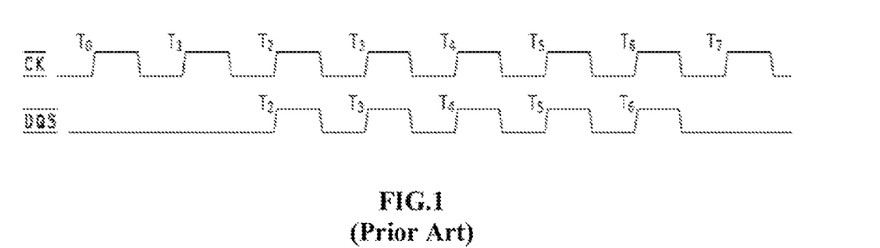
FIG. 1 is a prior art timing diagram describing the alignment of the clock signal (CLK) and data strobe signal (DQS) required at the DRAM ball.
Figure 1A:
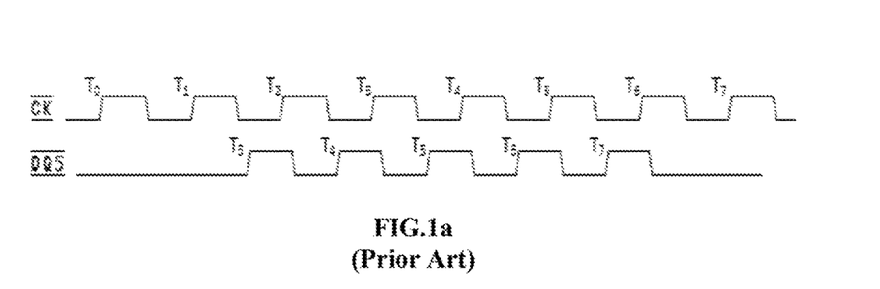
FIG. 1a is a prior art timing diagram describing the difference in phase length for the clock signal (CLK) and data strobe signal (DQS), when trace length is more than 'one' clock cycle at the DRM ball.
Figure 1B:
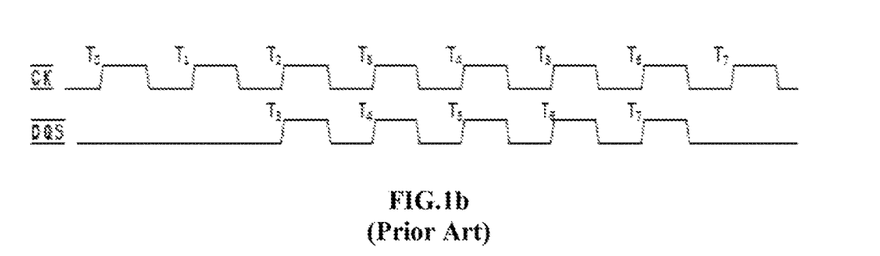
FIG. 1b is a prior art timing diagram describing the JEDEC write leveling to align the clock signal (CLK) and data strobe signal (DQS) at the DRM ball, for a trace difference mater than one clock cycle.

To achieve enhanced signal integrity at higher data rates, DDR3 memory modules typically adopt fly-by signal routing for clock (CK), address, command (for example, RAS_n, CAS_n and the like) and control signals (for example, CS_n, ODT, and the like) while matching the trace length for data (DQ) and data strobe (DQS). The consequence of incorporating fly-by topology is though at the DRAM controller, wherein CK and DQS could be designed to meet the DRAM timing specification (tDQSS) as shown in FIG. 1 but at the DRAM ball the CLK and DQS are no longer in phase given the difference in the trace lengths of CK and DQS as shown in FIG. 1a. In order to overcome the aforementioned drawback, the memory controller uses a feature termed as 'write leveling' wherein the feedback from the DDR3 DRAM is utilized to adjust/calibrate DQS (data strobe signal) with the clock signal. A conventional method specified by Joint Electron Device Engineering Council (JEDEC) to align clock signal (CK) and data strobe (DQS) is to perform write leveling using a simple feedback mechanism from a DRAM. However, this method is efficient only when the trace difference is less than a single DRAM clock cycle. When the trace difference is greater than one DRAM clock cycle, the specified method does not accomplish cycle matching at the DRAM ball as shown in FIG. 1b.

OBJECTS

An object of the present disclosure is to provide a method for appropriately aligning a data strobe signal with a clock signal.

Yet another object of the present disclosure is to provide a method that performs reliable write cycle for DDR3 based memory modules.

Still a further object of the present disclosure is to provide a method that enables DDR3 based modules to effectively adhere to tDQSS specification.

One more object of the present disclosure is to provide a method that enables aligning a data strobe signal and a dock signal with correct cycle relationship when DRAM fly-by delay is more than one DRAM clock cycle.

Yet another object of the present disclosure is to provide a method that enables appropriate alignment of clock signal and data strobe signal at DRAM ball.

Still a further object of the present disclosure is to provide a method that enables appropriate alignment of clock signal and data strobe signal at the DRAM ball when the trace difference between the dock signal and data strobe signal is more than 1 DRAM cycle.

One more object of the present disclosure is to envisage a method that provides for completely automatic write leveling, without any manual intervention.

Yet another object of the present disclosure is to envisage a method that effectively accounts for system jitter, noise and PCB skew.

SUMMARY

The present disclosure envisages a method for synchronizing a clock signal with a data strobe signal. The method, in accordance with the present disclosure incorporates the following steps: performing a first write operation on a memory module, and writing a first data pattern thereto; performing a second write operation on the memory module, and writing a second data pattern thereto; performing a third write operation on the memory module, and writing a third data pattern thereto, wherein the third write data pattern is same as second data pattern; iteratively gating predetermined beats of data strobe signals corresponding to the first write operation and the second write operation; determining a target pattern to be read from the memory module, based at least on gated data strobe signals; performing a data read operation on the memory module and reading data stored thereupon, and forming a forth data pattern, the forth data pattern comprising the data read from the memory module; determining whether the forth data pattern is equivalent to the target data pattern; determining the cycle delay between the clock signal and the data strobe signal corresponding to the data read operation, only in the event that the forth pattern is not equivalent to the target data pattern; and selectively adjusting a write delay corresponding to every write operation succeeding the first write operation, the second write operation and the third write operation repeated thereafter, by delaying the data strobe signals and corresponding data signals based on the cycle delay.

In accordance with the present disclosure, the method for synchronizing a clock signal with a data strobe signal, further includes the following steps: determining a burst length, the burst length being a value equivalent to number of beats that can be written into memory module and read from the memory module; writing a first data pattern having a length equivalent to the value of the burst length; writing a second data pattern having a length equivalent to the value of the burst length; and writing a third data pattern having a length equivalent to the value of the burst length.

In accordance with the present disclosure, the method for synchronizing a clock signal with a data strobe signal, further includes the following steps: storing the first data pattern on a first memory location of the memory module; storing the second data pattern on a second memory location of the memory module; and storing the third data pattern in a third memory location of the memory module; and wherein the first memory location, second memory location and third memory location are consecutive memory locations.

In accordance with the present disclosure, the step of performing a data read operation on the memory module, further includes the step of beginning to read from the second memory location of the memory module.

In accordance with the present disclosure, the forth data pattern is a combination of at least parts of the first data pattern and second data pattern written into the memory module via the first write operation and second write operation.

In accordance with the present disclosure, the step of iteratively gating predetermined cycles of data strobe signals corresponding to the first write operation and the second write operation, further includes the following steps: iteratively gating at least two data beats of the data strobe signal corresponding to the first write operation; and iteratively gating at least six data beats of the data strobe signal corresponding to the second write operation.

In accordance with the present disclosure, the step of delaying the data strobe signal and corresponding data signal, further includes the step of delaying the data strobe signal and corresponding data signal by at least one clock cycle for every repetition of a sequence involving a write operation and a read operation.

BRIEF DESCRIPTION OF THE DRAWINGS

The other objects, features and advantages will be apparent to those skilled in the art from the following description of the preferred embodiment and the accompanying drawings in which.

DETAILED DESCRIPTION

A conventional method specified by Joint Electron Device Engineering Council JEDEC) to align clock signal (CK) and data strobe (DQS) is to perform write leveling using a simple feedback mechanism from a DRAM. FIG. 1b illustrates a timing diagram describing the conventional 'write leveling' phenomenon standardized by the JEDEC. The memory controller typically utilizes the feedback from the DDR3 DRAM to adjust the relationship between the data strobe signal (DQS) and the clock signal (CLK), at DRAM pin. Typically the DRAM asynchronously feeds back CK-CK# (CK and CK# are differential clock inputs) which has been sampled at the rising edge of DQS-DQS# (differential data strobe signals; the data strobe signal DQS is always paired with differential data strobe signal DQS to provide differential pair signaling) through the DQ bus. The memory controller iteratively delays the DQS-DQS# signal until a transition point is detected. The DQS-DQS# delay thus formed ensures adherence to the tDQSS specification. However, this method is efficient only when the trace difference is less than a single DRAM clock cycle. When the trace difference (fly-by delay) is greater than one DRAM clock cycle, the specified method does trot accomplish cycle matching at the DRAM ball. Therefore, in order to overcome the disadvantages mentioned hitherto, the present disclosure envisages a method that provides for aligning data strobe signal (DQS) and clock signal (CLK) with appropriate cycle relationship when DRAM fly-by delay is greater than one DRAM clock cycle.

Figure 2:
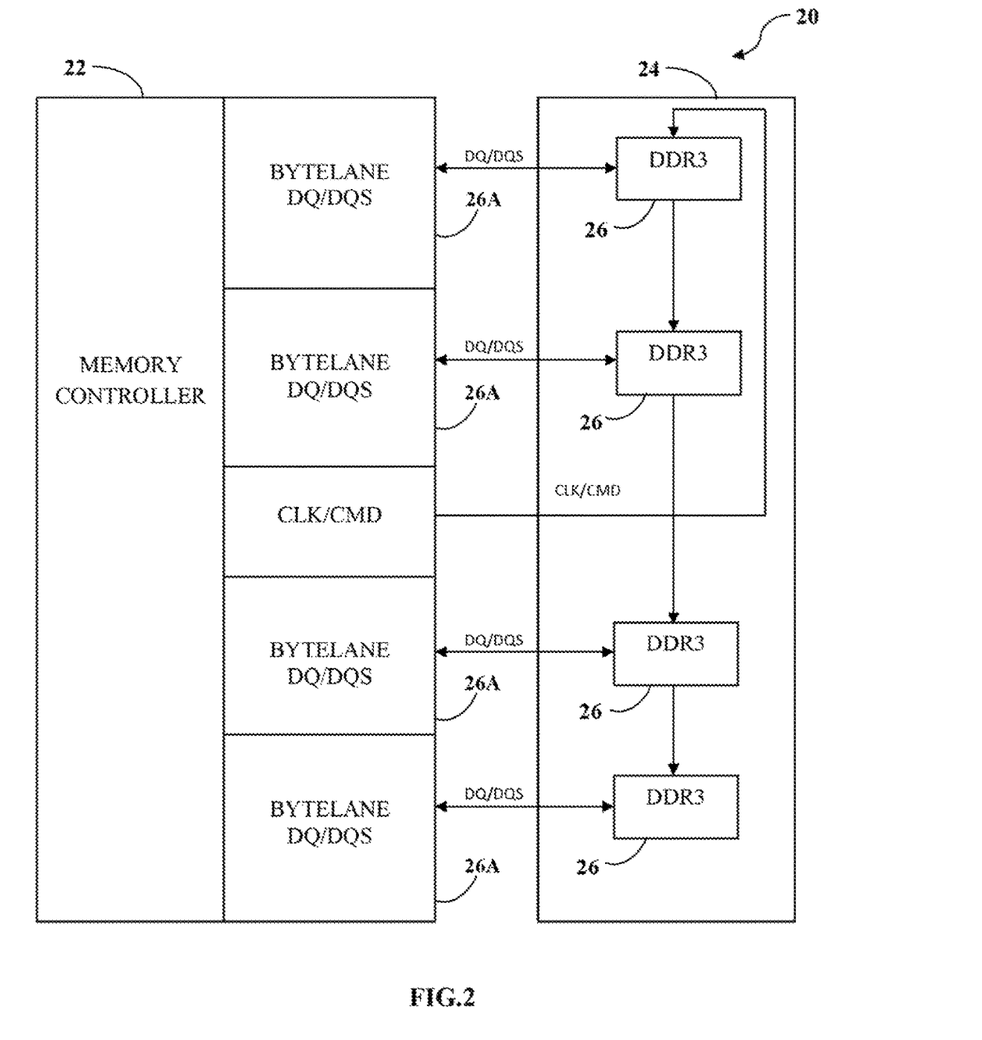
FIG. 2 is a block diagram describing the topology of a DDR DRAM, in accordance with the present disclosure.

FIG. 2 describes a DDR memory system 20. The DDR memory system 20 includes a memory controller integrated circuit (memory controller) 22 communicably coupled to a memory module integrated circuit (memory module) 24. Typically, the memory module 24 comprises multiple memory modules 26 with a clock path carrying clock signals (CLK) to the multiple memory modules 26 being configured based on a fly-by topology. In an exemplary embodiment, the memory module 24 comprises at least four DDR3 based modules 26, each of which can be accessed, in parallel, by its own dedicated byte lane 26A. The memory controller 22 is configured to transmit clock (CLK) and command (CMD) signals to the DDR3 memory modules 26 via CLK/CMD path. Subsequently, the memory controller 22 is configured to transmit data to the DDR3 modules 26 via four dedicated byte lanes 26A, and on a corresponding DQ/DQS (data signal/data strobe signal) path. Further, the memory controller 22 also receives data from any of the four DDR3 modules 26, on the DQ/DQS path, via the corresponding byte lane 26A.

Throughout the specification, the terms 'DQ' and 'data signal', and the terms 'DQS' and 'data strobe signal' are used interchangeably. In accordance with the present disclosure, since the data strobe signal (DQS) indicates the points at the data transmitted via the data signal (DQ) is sampled, it is necessary to align calibrate the data strobe (DQS) and the corresponding data signal (DQ) with the clock signal (CLK), in order to achieve appropriate data interpretation in DDR3 based modules 26. Especially in a memory write configuration, in order to enable the DDR3 based modules 26 to appropriately interpret the data transmitted as data signal, it is necessary for the relative timing of the DQS (data strobe signal) to be correctly calibrated/aligned, since the DQS indicates the points at which the data signal (carrying the data to be written onto the DDR3 based modules 26) is sampled. Ideally, post issuance of a write (WR) command signal, the data is received by any of the DDR3 based modules 26 on both the rising and falling edges of the DQS. The data is transmitted via the DQ signal, from the memory controller to an of the DDR3 based modules 26 after a write latency (WL) delay. In order for the write data to be correctly received by the intended DDR3 based modules 26, it its necessary for the respective DQS to be correctly aliened with the DQ data eye, which in turn requires the DQS and CLK to be correctly aligned with one another. Ideally, the rising edge and falling edge of the DQS should fail relatively centrally within the ese of the data signal (DQ).

Figure 3A:
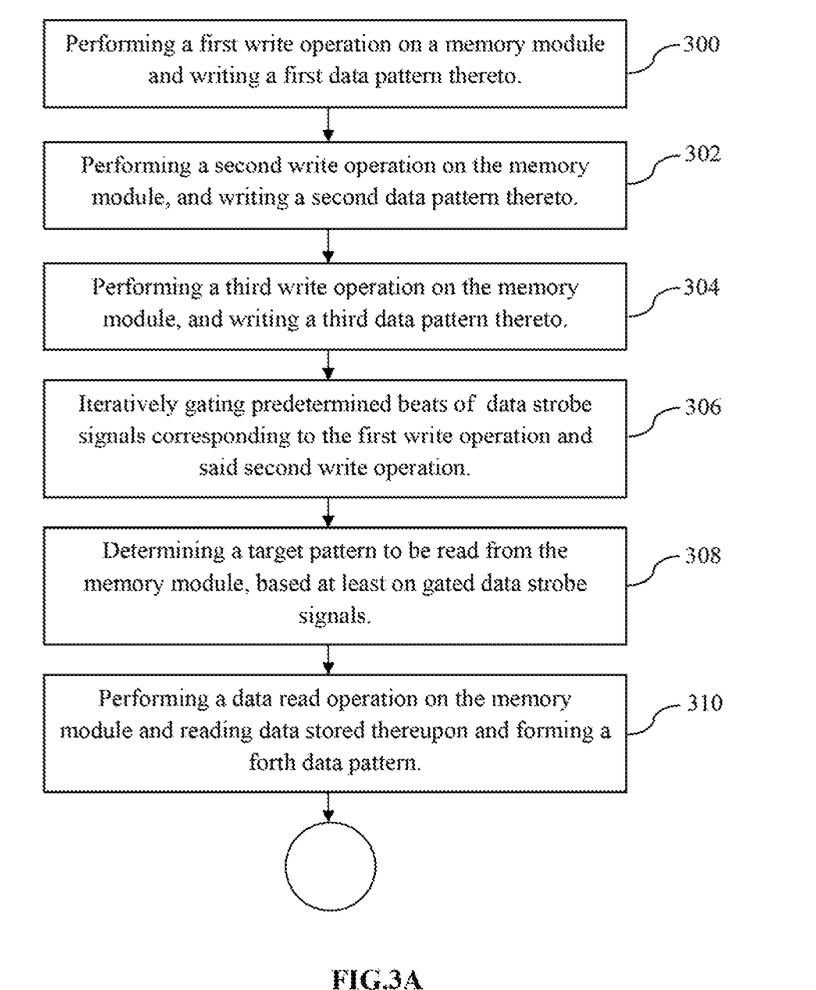
FIG. 3 is a flow chart illustrating the steps involved in the method for aligning the data strobe signal (DQS) with the clock signal (CLK), when DRAM fly-by delay is greater than one DRAM clock cycle, in accordance with the present disclosure.
Figure 3B:
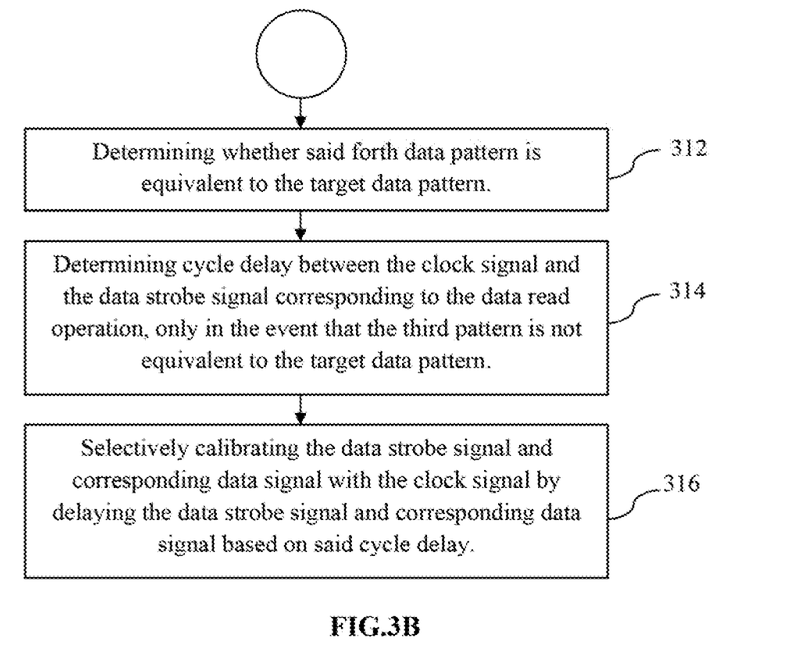

Referring to FIG. 3a and FIG. 3b its combination, there is shown a flow chart illustrating the steps involved in the method for aligning the data strobe signal (DQS) with the clock signal (CLK), when DRAM fly-by delay is greater than one DRAM clock cycle. The method, in accordance with the present disclosure is initiated at step 300 wherein a first write operation (by the way of issuing a first write command) is performed on the memory module (represented by reference numeral 24 in FIG. 2), and the memory controller (represented by reference numeral 22 in FIG. 2) writes '11111111' onto the memory module 24 (to the four DDR3 modules 26). At a next step 302, a second write operation (by the way of issuing a second write command) is performed on the memory module, and the memory controller writes '00000000' onto the memory module. At a next step 304, the memory controller once again writes '00000000' onto the memory module, via a third write operation which is performed in response to the issuance of a third write command. The burst length (indicative of the number of data bytes that could be written into/read from the memory module) for the first write operation, second write operation and third write operation is set at "8". The data corresponding to the 'first write operation', 'second write operation' and 'third write operation' is written into consecutive address locations of the memory module.

At a next step 306, predetermined beats (two beats, i.e., an upbeat and a downbeat in combination constitute a cycle) of data strobe signals corresponding to the first write operation and second write operation are iteratively gated. For example, the 'seventh' and 'eighth' beats of the data strobe signal corresponding to the first write command, and 'first', 'second', 'third,' 'fourth', 'fifth', 'sixth' beats of the data strobe signal corresponding to the second write command are iteratively gated. In case of the gated beats, the data represented by each of the gated beats is flipped from '1' to '0' in case of the first write operation. Further, in case of the second write operation, the data represented by each of the gated beats is flipped from '1' to '0'. Therefore, in accordance with the present disclosure, the data written onto the memory module, subsequent to gating of the data strobe signal corresponding to the first write operation would be '11111100'. Further, the data written onto the memory module subsequent to gating of the data strobe signal corresponding to the second write operation would be '11111100'.

Figure 4A:
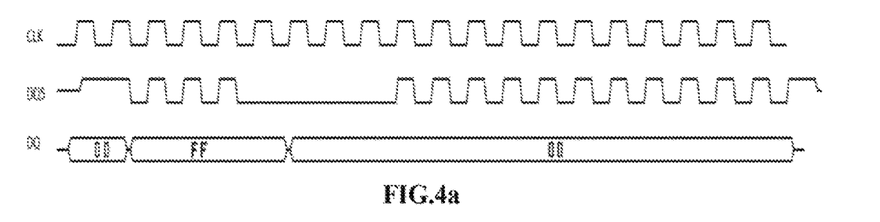
FIG. 4a is a timing diagram illustrating a series of three write operations, each of burst length 'eight', and gating of predetermined beats of first and second write operations, in accordance with the present disclosure.

Referring to FIG. 4a, there is shown a timing diagram illustrating a (total) series of three write operations ('first write operation', 'second write operation', and 'third write operation'). Each of the write operations has a burst length of '8'. The data strobe signal (DQS) corresponding to the first write operation is gated for 'seventh' and 'eighth' beat, and the data strobe signal (DQS) corresponding to the second write operation is gated for 'first', 'second', 'third', 'fourth', 'fifth', 'sixth' beats as seen in FIG. 4a.

Referring again to FIG. 3a, at step 308, at least based on the gating of predetermined data strobes, a target pattern to be read from the memory module is identified. Preferably, based on the data originally written by the way of the first write operation, second write operation and third write operation, and further based on the gated data strobe signals corresponding to the first write operation and second write operation, a target pattern to be read from the memory module is identified. At step 310, a data read operation is performed on the memory module, and the data is read from the memory location where the data corresponding to the second write operation was initially stored. The data thus read from the memory module is termed as 'forth data pattern'. While the term forth data pattern specifies the data pattern actually read from the memory device via the data read operation, the term 'target data pattern' specifies the data pattern to be read from the memory in view of the three write operations and subsequent gating of predetermined beats of data strobe signals of predetermined write operations.

Figure 4B:
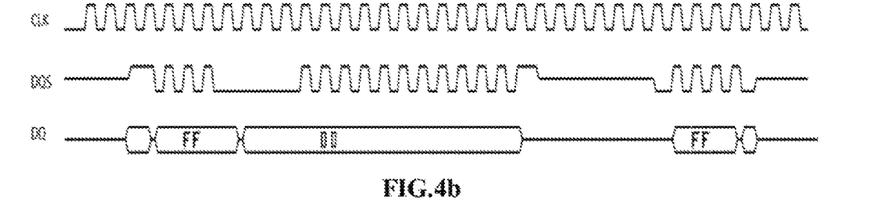
FIG. 4b is a timing diagram illustrating three write operations and a following read operation performed on the memory device, and gating of predetermined beats of first and second write operations, in accordance with the present disclosure.

Referring to FIG. 4b, there is shown a timing diagram illustrating a series of 'three' write operations followed by a read operation. The 'three' write operations and the read operation have a burst length of '8'. Further, FIG. 4b illustrates the additional data strobe signals (DQS) generated for completing '24' rising and falling transitions for data strobe signal (DQS) for completing a total of 'three' write operations.

Referring again to FIG. 3b, at step 312, the data pattern received as a result of the read operation is analyzed to determine whether there exists any cycle delay between the data strobe signal (DQS) and the clock signal (CLK). At the step 312, preferably, the existence of the cycle delay is checked for, if the fourth data pattern extracted from the memory module via the data read operation is not equivalent to the target data pattern.

In accordance with the present disclosure, a target data pattern (to be read from the memory device) is determined based on the data originally written during the first write operation, second write operation and third write operation, and further based on the gated data strobe signals corresponding to the first write operation and second write operation. As the data read operation is initiated from the memory location where the second write operation was initially performed, the target data pattern is determined.

In accordance with the present disclosure, subsequent to gating of 'seventh' and 'eighth' beats of the data strobe signal corresponding to the first write command, and 'first', 'second', 'third,' 'fourth', 'fifth', 'sixth' beats of the data strobe signal corresponding to the second write command, if the data strobe signal (DQS) and the clock signal (CLK) were to be perfectly aligned/calibrated with one another, the target data pattern expected to be returned (as a result of the data read operation) would be '11111100' (the data for the 'first', 'second', 'third,' 'fourth', 'fifth', 'sixth' beats of the second write operation flipped from '0' to '1', and the data for the 'seventh' and 'eight' beats of the second write operation retained as '0' without the application of gating operation).

Figure 5A:
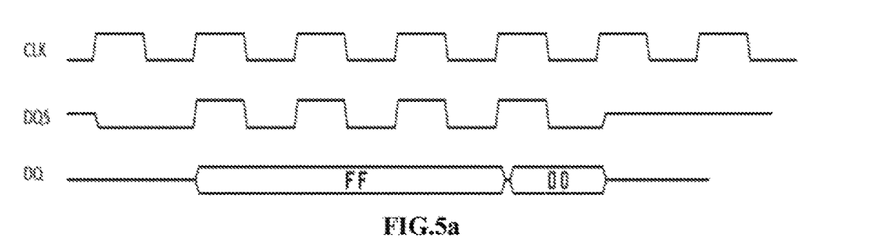
FIG. 5a is a timing diagram illustrating the read data returned from the memory device, with the data strobe signal (DQS) matching the clock signal (CLK), in accordance with the present disclosure.

Referring to FIG. 5a, there is shown a timing diagram illustrating the fourth data pattern that would have been returned from the memory module (as a result of the data read operation), had the data strobe signal (DQS) perfectly aligned with the clock signal (CLK), with the 'first', 'second', 'third', 'fourth', 'fifth', 'sixth' beats of the second write operation being flipped from '0' to '1', and the 'seventh' and 'eighth' beats being retained at '0'. The data read operation is performed on the memory device location on which the second write operation was initially performed.

Figure 5B:
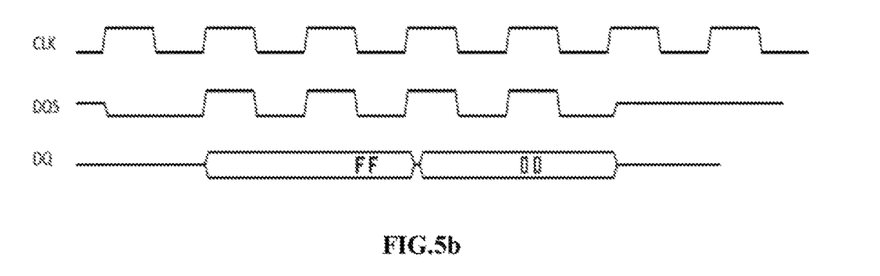
FIG. 5b is a timing diagram illustrating the read data returned from the memory device, with the data strobe signal (DQS) ahead of the clock signal (CLK) by one clock cycle, in accordance with the present disclosure.

Referring to FIG. 5b, there is shown a timing diagram illustrating the fourth data pattern returned from the memory module (as a result of the data read operation) in a scenario wherein the data strobe signal (DQS) is not aligned/calibrated with the clock signal (CLK). As shown in FIG. 5b, there exists a delay of 'one' cycle between the data strobe signal (DQS) and the clock signal (CLK), since only a total of 'four' beats ('first', 'second', 'third', 'fourth') corresponding to the second write operation are flipped instead of (predetermined) 'six' beats.

Referring again to FIG. 3b, at a step 314, when the target pattern is compared with the fourth data pattern, if the fourth data patter (read from the memory) is '11110000' (a total of 'four' beats, i.e., the 'first', 'second', 'third' and 'fourth' beats being flipped, instead of 'six' predetermined beats), which is a deviation from the target pattern '11111100', the delay between the data strobe signal (DQS) and clock signal (CLK) is determined to be 'one' cycle. Alternatively, if the fourth data pattern (read from the memory) is '11000000' (a total of 'two' beats, i.e., the 'first' and 'second' beat being flipped, instead of 'six' predetermined beats), the delay between the data strobe signal (DQS) and clock signal (CLK) is determined to be 'two' cycles. Otherwise, the delay between the data strobe signal (DQS) and clock signal (CLK) is considered to be greater than 'two' cycles.

At a step 316, the data strobe signal and the corresponding data signal are calibrated in the event that a cycle delay has been detected at step 314. If no cycle delay is detected at step 314, the data strobe signals and data signal are unaltered at step 316. In accordance with the present disclosure, if a cycle delay is detected at step 314, the data strobe signal and the corresponding data signal are delayed with reference to the timing of the clock signal, to compensate for the cycle delay at the step 316. In accordance with the present disclosure, the data strobe signal and data signal are delayed with reference to the timing of the clock signal, for every sequence of a data write operation and data read operation succeeding the 'first', 'second', and 'third' data write operations, and the data read operation till the forth data pattern matches the target data pattern.

Figure 6:
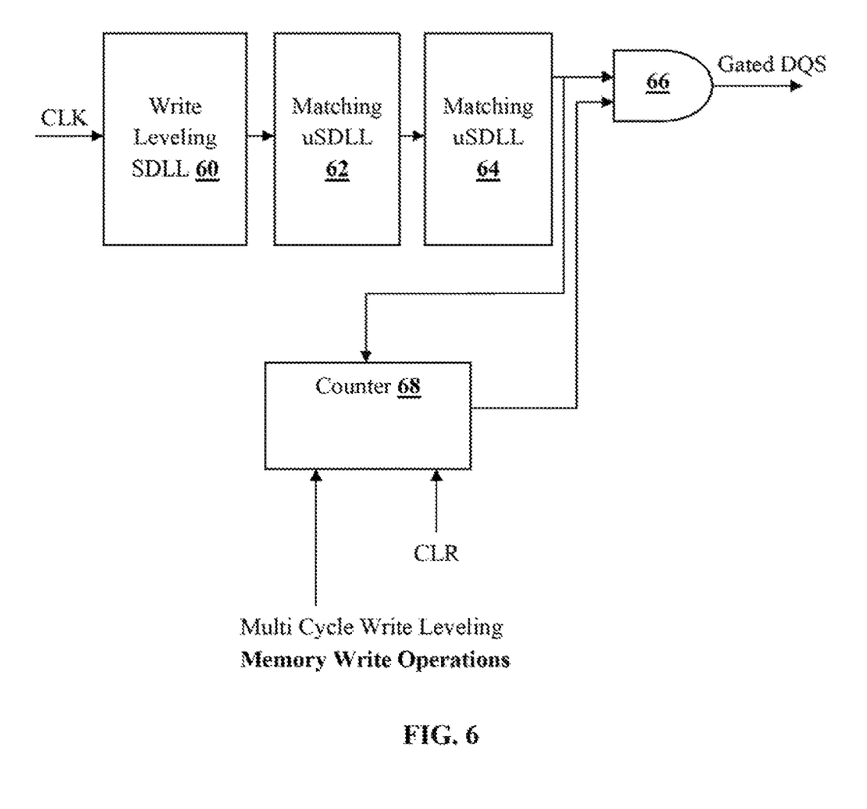
FIG. 6 illustrates a set of components on a DQS Path of system illustrated in FIG. 2

In accordance with the present disclosure, FIG. 6 illustrates a set of components on a DQS path of the system illustrated in FIG. 2. As shown in FIG. 6, the DQS path incorporates a write leveling slave delay locked loop (SDLL) 60 configured to delay the data strobe signal for write leveling. Further, two matching SDLL modules 62 and 64 are incorporated in order compensate for the SDLLs present on the data signal (DQ) path (not shown in figures). In order to gate the data strobe pulses for the predetermined edges (predetermined beats) of the data strobe signal (DQS) corresponding to memory write operations, an AND gate 66 is incorporated in the path of the data strobe signal (DQS). A counter 68 clocking on the output clock of the SDLL module 64 counts the active pulses beginning from the first write operation. A clear signal (CLR) is used to reset the counter 68 prior to initiating a sequence of memory write and memory read operations. The counter 68 is configured to generate a gating signal which is specifically held low to gate the 'fourth', 'fifth', 'sixth', 'seventh' rising edges (clock pulses) of the output clock of the module 64. Further, the gated clock pulses appear as gated data strobes at the memory device such that the 'seventh' and 'eighth' beats are gated for the first write operation, and 'first', 'second', 'third', 'fourth', 'fifth', 'sixth' beats are gated for the second write operation. The phenomenon of gating predetermined beats is repeated for every sequence of write and read operations performed on the memory module until the data strobe signal (DQS) and the clock signal (CLK) are calibrated/aligned.

In accordance with the present disclosure, the system and method envisaged herein are configured to handle any number of cycle delays between the data strobe signal (DQS) and the clock signal (CLK). Further, system and method are also configured to address the scenario of the data strobe signal (DQS) lags behind the clock signal (CLK) as well as the scenario of the clock signal (CLK) lagging behind the data strobe signal (DQS).

The technical advantages envisaged by the present disclosure include the realization of a method for appropriately aligning a data strobe signal with a clock signal. The method performs reliable write cycle for DDR3 based memory modules. The method enables DDR3 based modules to effectively adhere to tDQSS specifications. The method that enables aligning a data strobe signal and a clock signal with correct cycle relationship when DRAM fly-by delay is more than one DRAM clock cycle. The method also enables appropriate alignment of clock signal and data strobe signal at DRAM ball. The method enables appropriate alignment of clock signal and data strobe signal at the DRAM ball when the trace difference between the clock signal and data strobe signal is more than 1 DRAM cycle. The method provides for completely automatic write leveling, without any manual intervention. The method effectively accounts for system jitter and noise. The implementation of the said method is efficient and effective despite the presence of jitter and PCB skew.

What is claimed is:
1. A method for synchronizing a clock signal with a data strobe signal, said method comprising the following steps:
  performing a first write operation on a memory module and writing a first data pattern onto a first memory location of the memory module;
  performing a second write operation on the memory module, and writing a second data pattern onto a second memory location of the memory module;
  performing a third write operation on the memory module, and writing a third data pattern onto a third memory location of the memory module;
  iteratively masking at least two beats of the data strobe signal corresponding to said first write operation;
  iteratively masking at least six beats of the data strobe signal corresponding to said second write operation;
  determining a target pattern to be read from the memory module, based at least on gated data strobe signals;
  performing a data read operation on said memory module and reading data stored thereupon, and forming a forth data pattern, said forth data pattern comprising the data read from said memory module;
  determining whether said forth data pattern is equivalent to the target data pattern;

determining cycle delay between the clock signal and the data strobe signal corresponding to the data read operation, only in the event that the forth data pattern is determined to be not equivalent to the target data pattern;

selectively calibrating the data strobe signal and corresponding data signal with the clock signal by delaying the data strobe signal and corresponding data signal based on said cycle delay;

determining a burst length, said burst length having a value equivalent to number of beats that can be written into and read from said memory module, in one write operation and one read operation respectively; and configuring said first data pattern, second data pattern and third data pattern to incorporate the number of beats equivalent to the value specified by the burst length.

2. The method as claimed in claim 1, wherein said first memory location, second memory location and third memory location are consecutive memory locations.

3. The method as claimed in claim 1, wherein the step of performing a data read operation on said memory module, further includes the step of initiating said data read operation from said second memory location of said memory module.

4. The method as claimed in claim 1, wherein the forth data pattern is a combination of at least parts of said first data pattern and second data pattern written into said memory module via said first write operation and second write operation.

5. The method as claimed in claim 1, wherein the step of delaying said data strobe signal and corresponding data signal, further includes the step of delaying the data strobe signal and corresponding data signal based on said cycle delay for every repetition of a sequence of a write operation and a read operation.

6. A system for synchronizing a clock signal with a data strobe signal, said system comprising at least one memory module cooperating with a memory controller, wherein said memory controller is configured to:

perform a first write operation on the memory module, and write a first data pattern thereto;

perform a second write operation on the memory module, and write a second data pattern thereto;

perform a third write operation on the memory module, and write a third pattern thereto;

iteratively mask at least two beats of data strobe signal corresponding to said first write operation;

iteratively mask at least six beats of the data strobe signal corresponding to said second write operation;

determine a target pattern to be read from the memory module, based at least on gated data strobe signals;

perform a data read operation on said memory module and read data stored thereupon, and generate a forth data pattern incorporating the data read from said memory module;

determine whether said forth data pattern is equivalent to the target data pattern;

determine a cycle delay between the clock signal and the data strobe signal corresponding to the data read operation, only in the event that the firth data pattern is determined not to be equivalent to the target data pattern;

selectively calibrate the data strobe signal and corresponding data signal with the clock signal by delaying the data strobe signal and corresponding data signal based on said cycle delay;

determine a burst length, said burst length having a value equivalent to number of beats that can be written into and read from said memory module, in one write operation and one read operation respectively; and configure said first data pattern, second data pattern and third data pattern to incorporate the number of beats equivalent to the value specified by the burst length.

\* \* \* \* \*